(12) United States Patent
Cho et al.

(10) Patent No.: US 10,746,802 B2
(45) Date of Patent: Aug. 18, 2020

(54) SYSTEM AND METHOD FOR PREVENTING ABNORMAL OPENING OF CONTACTOR THROUGH REAL-TIME OPERATION DETECTION

(71) Applicant: LG CHEM, LTD., Seoul (KR)

(72) Inventors: Hyunki Cho, Daejeon (KR); Sang Hoon Lee, Daejeon (KR); Jaedong Park, Daejeon (KR); Chang Hyun Sung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 191 days.

(21) Appl. No.: 16/066,239

(22) PCT Filed: Jan. 24, 2017

(86) PCT No.: PCT/KR2017/000823
§ 371 (c)(1),
(2) Date: Jun. 26, 2018

(87) PCT Pub. No.: WO2018/012696
PCT Pub. Date: Jan. 18, 2018

(65) Prior Publication Data
US 2020/0124672 A1  Apr. 23, 2020

(30) Foreign Application Priority Data

Jul. 15, 2016  (KR) ........................ 10-2016-0090276

(51) Int. Cl.
*B60Q 1/00* (2006.01)
*G01R 31/327* (2006.01)
(Continued)

(52) U.S. Cl.
CPC ...... *G01R 31/3278* (2013.01); *B60R 16/0232* (2013.01); *G01R 31/3842* (2019.01); *H01H 47/002* (2013.01)

(58) Field of Classification Search
None
See application file for complete search history.

(56) References Cited

U.S. PATENT DOCUMENTS

| 9,054,538 B2 | 6/2015 | Kim | |
| 2012/0020136 A1* | 1/2012 | Akaishi | H02M 7/48 |
| | | | 363/131 |

(Continued)

FOREIGN PATENT DOCUMENTS

| JP | 5-316743 A | 11/1993 |
| JP | 09-037405 A | 2/1997 |

(Continued)

OTHER PUBLICATIONS

International Search Report for PCT/KR2017/000823 (PCT/ISA/210) dated Apr. 19, 2017.

*Primary Examiner* — Adolf Dsouza
(74) *Attorney, Agent, or Firm* — Birch, Stewart, Kolasch & Birch, LLP (57) ABSTRACT

A system and a method in which a contactor coil control unit, which applies an operation signal to a contactor coil (relay coil) that opens or connects contact points of a contactor (Relay), during a travelling of a vehicle applies an abnormal signal to the contactor coil by an external reason or a failure, the abnormal signal is detected in real time, so that it is possible to prevent the contact point of the contactor from being unintentionally opened by the abnormal signal, and it is possible to prevent an operating vehicle from being suddenly stopped by determining whether the vehicle actually travels based on a maintenance time of the abnormal signal and whether the abnormal signal is applied due to an actual failure of the contactor coil control unit.

20 Claims, 4 Drawing Sheets

(51) Int. Cl.
*G01R 31/3842* (2019.01)
*B60R 16/023* (2006.01)
*H01H 47/00* (2006.01)

(56) References Cited

U.S. PATENT DOCUMENTS

| | | | |
|---|---|---|---|
| 2014/0356686 A1 | 12/2014 | Namou et al. | |
| 2016/0261127 A1* | 9/2016 | Worry | G01R 31/3842 |
| 2016/0372940 A1* | 12/2016 | Canadi | G01R 19/16542 |
| 2018/0166244 A1* | 6/2018 | Kobayashi | H01H 50/02 |

FOREIGN PATENT DOCUMENTS

| | | |
|---|---|---|
| JP | 09-172781 A | 6/1997 |
| JP | 2006-121865 A | 5/2006 |
| JP | 2006-311640 A | 11/2006 |
| JP | 2010-041821 A | 2/2010 |
| JP | 2014-3742 A | 1/2014 |
| KR | 10-2000-0045987 A | 7/2000 |
| KR | 10-2014-0029800 A | 3/2014 |

* cited by examiner

SYSTEM AND METHOD FOR PREVENTING ABNORMAL OPENING OF CONTACTOR THROUGH REAL-TIME OPERATION DETECTION

TECHNICAL FIELD

This application claims priority to and the benefit of Korean Patent Application No. 10-2016-0090276 filed in the Korean Intellectual Property Office on Jul. 15, 2016, the entire contents of which are incorporated herein by reference.

The present invention relates to a system and a method of preventing a contactor from being abnormally opened through a real-time operation detection, and more particularly, to a system and a method of preventing a contactor from being abnormally opened through a real-time operation detection, in which when a contactor coil control unit, which applies an operation signal to a contactor coil (relay coil) that opens or connects contact points of a contactor (relay), during a travelling of a vehicle applies an abnormal signal to the contactor coil due to an external reason or failure, the abnormal signal is detected in real time, so that it is possible to prevent the contact point of the contactor from being unintentionally opened by the abnormal signal, and particularly, it is possible to prevent an operating vehicle from being suddenly stopped by determining whether the vehicle actually travels based on a maintenance time of the abnormal signal and whether the abnormal signal is applied due to an actual failure of the contactor coil control unit.

BACKGROUND ART

In general, a plug-in hybrid electric vehicle (PHEV), which travels by using energy output from a battery as a power source, requires a charge of an internal battery according to driving of a motor of a vehicle, and in this case, a switching element called a contactor (or relay) is used in order to electrically conduct or block a current flowing between a charging source and the battery.

In the internal circuit of the PHEV, when it is necessary to protect various elements in a situation where an overcurrent exceeding a threshold value flows, an operation state of a contact point of the contactor is changed from an open state to a connection (close) state and a current in a circuit is blocked, thereby protecting various elements from the overcurrent.

In the meantime, the contactor may be generally implemented with contact points and a contactor coil, and when power is supplied to the contactor coil and electromagnetic force is generated, the contact points are in contact with one another and a current may be conducted, and in this case, the supply of power to the contactor coil is generally available through a contactor coil control unit.

The contactor coil control unit may allow electromagnetic force to be generated in the contactor coil by supplying power to the contactor coil, and in contrast to this, the contactor coil control unit may also collect the electromagnetic force of the contactor coil by blocking the supply of power.

In this case, when the contactor coil control unit applies an operation signal which unintentionally stops an operation of the contactor coil due to a sudden failure to the contactor coil, the operation of the contactor coil may be unintentionally stopped, and thus, there is a concern that the current conduction in the circuit is blocked while the contact points of the contactor are opened.

Particularly, when the conduction of the current in the circuit connected with the motor and the battery is blocked during the operation of the vehicle, a rotation of the motor is stopped and thus the vehicle suddenly stops, and when the corresponding vehicle is travelling at an overspeed, a safety accident may be incurred by the sudden stop.

In order to solve the various problems, contactor detecting technologies and methods of diagnosing an abnormal operation of a contactor and handling the abnormal operation have been developed in the related art, but when the contactor coil control unit applies an abnormal signal, the related arts cannot accurately determine whether the corresponding abnormal signal is a signal generated by an external impact of a vehicle or a signal generated by an actual failure of the contactor coil control unit, and particularly, the related arts have limitations in that there is no technology for maintaining a connection state of a contact point of a contactor for a predetermined time in a situation where an abnormal signal is applied from the contactor coil control unit, so that there is a concern that the contact point of the contactor is opened during an operation situation of a vehicle, or forcibly opening the contact point of the contactor in a situation where an operation of the vehicle is impossible.

Accordingly, in order to solve the various problems of the contactor, and the technology and the method for detecting, diagnosing, and controlling a contactor in the related art, the present inventor develops a system and a method of preventing a contactor from being abnormally opened through a real-time operation detection, in which when a contactor coil control unit, which applies an operation signal to a contactor coil (relay coil) that opens or connects contact points of a contactor (relay), during a travelling of a vehicle applies an abnormal signal to the contactor coil by an external reason or a failure, the abnormal signal is detected in real time, so that it is possible to prevent the contact point of the contactor from being unintentionally opened by the abnormal signal, and particularly, it is possible to prevent an operating vehicle from being suddenly stopped by determining whether the vehicle actually travels based on a maintenance time of the abnormal signal and whether the abnormal signal is applied due to an actual failure of the contactor coil control unit.

DETAILED DESCRIPTION OF THE INVENTION

Technical Problem

The present invention is conceived to solve the aforementioned problem, and an object of the present invention is to provide a system and a method of preventing a contactor from being abnormally opened through a real-time operation detection, in which when a contactor coil control unit, which applies an operation signal to a contactor coil (relay coil) that opens or connects contact points of a contactor (relay), during a travelling of a vehicle applies an abnormal signal to the contactor coil by an external reason or a failure, the abnormal signal is detected in real time, so that it is possible to prevent the contact point of the contactor from being unintentionally opened by the abnormal signal, and particularly, it is possible to prevent an operating vehicle from being suddenly stopped by determining whether the vehicle actually travels based on a maintenance time of the abnormal signal and whether the abnormal signal is applied due to an actual failure of the contactor coil control unit.

Technical Solution

According to an exemplary embodiment of the present invention, a system for preventing a contactor from being abnormally opened through a real-time operation detection includes: a contactor coil provided in a contactor that connects a battery and an inverter; a contactor coil control unit which applies an operation signal to the contactor coil; and a main control unit which detects the operation signal applied from the contactor coil control unit in real time through an execution of a first detection mode, and executes a second detection mode and directly controls an operation state of the contactor coil based on a maintenance time of an abnormal signal when it is determined that the applied operation signal is the non-predetermined abnormal signal.

In the exemplary embodiment, the first detection mode may be a normal mode executed when the contactor coil control unit applies the operation signal, and the second detection mode may be a maintenance mode executed for preventing a contact point of the contactor from being opened according to the application of the abnormal signal from the contactor coil control unit.

In the exemplary embodiment, the main control unit may set a counting time for maintaining a contact point of the contactor in a close state for a predetermined time during the execution of the second detection mode.

In the exemplary embodiment, when the maintenance time of the abnormal signal is less than the counting time during the execution of the second detection mode, the main control unit may determine whether the contactor coil control unit applies a predetermined operation signal, and when it is determined that the contactor coil control unit applies the predetermined operation signal, the main control unit may execute the first detection mode.

In the exemplary embodiment, when the maintenance time of the abnormal signal exceeds the counting time during the execution of the second detection mode, the main control unit may forcibly open the contact point of the contactor.

In the exemplary embodiment, the main control unit may generate an alarm signal according to the forcible open of the contact point of the contactor.

In the exemplary embodiment, the main control unit may determine whether the vehicle is operated in real time based on an output voltage of the battery during the execution of the second detection mode, and when it is determined that the vehicle is currently operated as a result of the determination, the main control unit may set the counting time.

In the exemplary embodiment, the main control unit may determine whether the abnormal signal is a signal generated by an external impact of the vehicle or a signal generated by a failure of the contactor coil control unit based on the maintenance time of the abnormal signal during the execution of the second detection mode, and when it is determined that the contactor coil control unit incurs failure, the main control unit may generate an alarm signal for the failure of the contactor coil control unit.

In the exemplary embodiment, the main control unit may include first and second main control units which are connected to terminals of both poles of the contactor coil, respectively, and the main control unit may directly control an operation state of the contactor coil according to the maintenance time of the abnormal signal through the first and second main control units.

In the exemplary embodiment, the present invention may further include: a voltage determining unit which measures a voltage of the battery and a voltage of the inverter according to the operation signal applied from the contactor coil control unit; and a current determining unit which measures a current flowing between the battery and the inverter according to the operation signal applied from the contactor coil control unit, in which the main control unit may determine that the applied operation signal is a non-predetermined abnormal signal according to the measured current and a voltage difference between the battery and the inverter.

According to another exemplary embodiment of the present invention, a method of preventing a contactor from being abnormally opened through a real-time operation detection includes: applying, by a contactor coil control unit, an operation signal to a contactor coil provided in a contactor that connects a battery and an inverter; and detecting, by a main control unit, the operation signal applied from the contactor coil control unit in real time through an execution of a first detection mode, and executing a second detection mode and directly controlling an operation state of the contactor coil based on a maintenance time of an abnormal signal when it is determined that the applied operation signal is the non-predetermined abnormal signal.

In the exemplary embodiment, in the directly controlling of the operation state of the contactor coil, the first detection mode may be a normal mode executed when the contactor coil control unit applies the operation signal, and the second detection mode may be a maintenance mode executed for preventing a contact point of the contactor from being opened according to the application of the abnormal signal from the contactor coil control unit.

In the exemplary embodiment, the directly controlling of the operation state of the contactor coil may include setting a counting time for maintaining a contact point of the contactor in a close state for a predetermined time during the execution of the second detection mode.

In the exemplary embodiment, the directly controlling of the operation state of the contactor coil may include, when the maintenance time of the abnormal signal is less than the counting time during the execution of the second detection mode, determining, by the main control unit, whether the contactor coil control unit applies a predetermined operation signal, and when it is determined that the contactor coil control unit applies the predetermined operation signal, executing, by the main control unit, the first detection mode.

In the exemplary embodiment, the directly controlling of the operation state of the contactor coil may include, when the maintenance time of the abnormal signal exceeds the counting time during the execution of the second detection mode, forcibly opening, by the main control unit, the contact point of the contactor.

In the exemplary embodiment, the directly controlling of the operation state of the contactor coil may further include generating an alarm signal according to the forcible open of the contact point of the contactor.

In the exemplary embodiment, the directly controlling of the operation state of the contactor coil may further include determining, by the main control unit, whether the vehicle is operated in real time based on an output voltage of the battery during the execution of the second detection mode, and when it is determined that the vehicle is currently operated as a result of the determination, setting the counting time.

In the exemplary embodiment, the directly controlling of the operation state of the contactor coil may include determining, by the main control unit, whether the abnormal signal is a signal generated by an external impact of the vehicle or a signal generated by a failure of the contactor coil control unit based on the maintenance time of the abnormal signal during the execution of the second detection mode, and when it is determined that the contactor coil control unit incurs failure, generating an alarm signal for the failure of the contactor coil control unit.

In the exemplary embodiment, the directly controlling of the operation state of the contactor coil may include directly controlling an operation state of the contactor coil according to the maintenance time of the abnormal signal through first and second main control units, which are included in the main control unit and are connected to terminals of both poles of the contactor coil, respectively.

In the exemplary embodiment, the present invention may further include: measuring, by a voltage determining unit, a voltage of the battery and a voltage of the inverter according to the operation signal applied from the contactor coil control unit; and measuring, by a current determining unit, a current flowing between the battery and the inverter according to the operation signal applied from the contactor coil control unit, in which the directly controlling of the operation state of the contactor coil includes determining, by the main control unit, that the applied operation signal is a non-predetermined abnormal signal according to the measured current and a voltage difference between the battery and the inverter.

Advantageous Effects

According to an aspect of the present invention, it is possible to accurately determine whether an abnormal signal is a signal simply generated by an external impact of a vehicle or a signal generated by a failure of the contactor coil control unit based on a maintenance time of the abnormal signal applied from the contactor coil control unit, thereby diagnosing a failure of the contactor coil control unit.

Further, according to the aspect of the present invention, in determining the abnormal signal applied from the contactor coil control unit, it is possible to determine whether a vehicle is actually currently operated based on driving states of a battery and a motor of the vehicle, and thus it is possible to defer a forcible open of a contact point of a contactor for a predetermined time when the vehicle is being operated, thereby preventing a safety accident incurrable by a sudden stop.

Further, according to the aspect of the present invention, in a situation where the maintenance time of the abnormal signal exceeds a predetermined counting time due to a failure of the contactor coil control unit and an operation of the vehicle is impossible, it is possible to generate an alarm signal according to the corresponding situation and provide the generated alarm signal to a dash board of the vehicle or a user terminal, thereby helping a user to recognize that the current operation of the vehicle is expected to stop in advance.

Further, according to the aspect of the present invention, in a situation where a maintenance mode, which is executed for preventing the contact point of the contactor from being opened according to an application of the abnormal signal by the contactor coil control unit, when a failure of the contactor coil control unit is recovered and an abnormal vehicle operation is allowed, the maintenance mode may be automatically returned to a normal mode for detecting the contactor coil control unit in real time, thereby always controlling an operation state of the contactor regardless of the travelling of the vehicle.

MODE FOR CARRYING OUT THE INVENTION

Hereinafter, exemplary embodiments will be provided for helping to understand the present invention. However, the following exemplary embodiment are provided only for the purpose of more easily illustrating the present invention, and the contents of the present invention are not limited by the exemplary embodiment.

Figure 1:
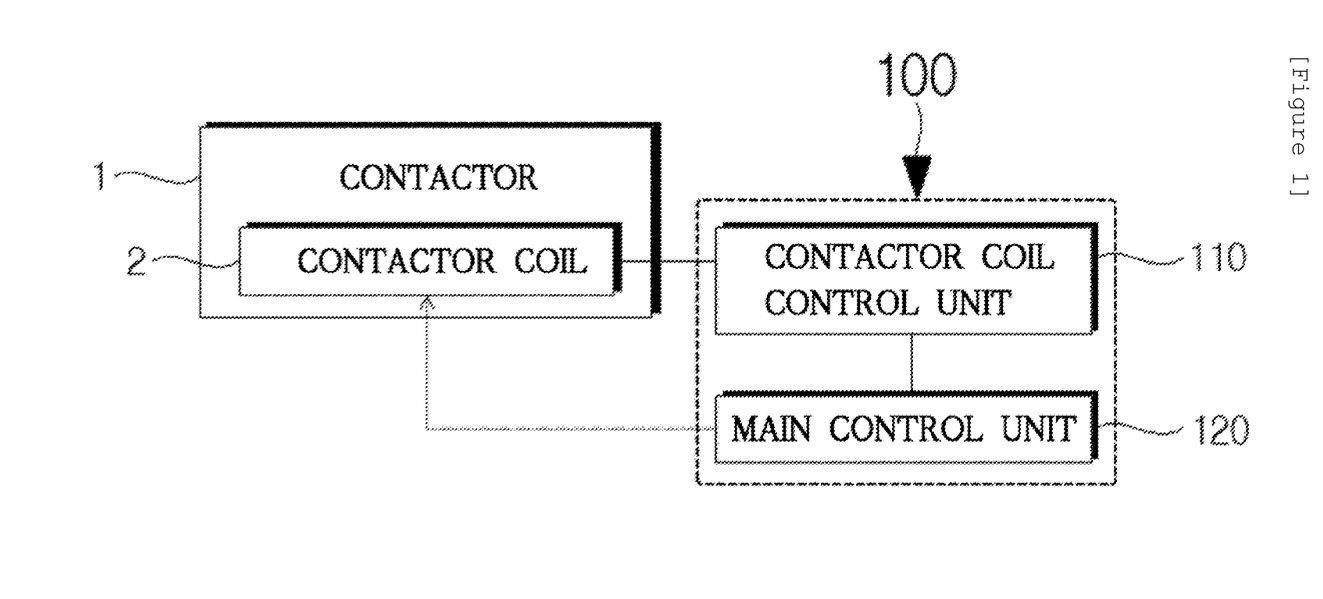
FIG. 1 is a diagram illustrating a schematic configuration of a system 100 for preventing a contactor from being abnormally opened through a real-time operation detection according to an exemplary embodiment of the present invention.
Figure 2:
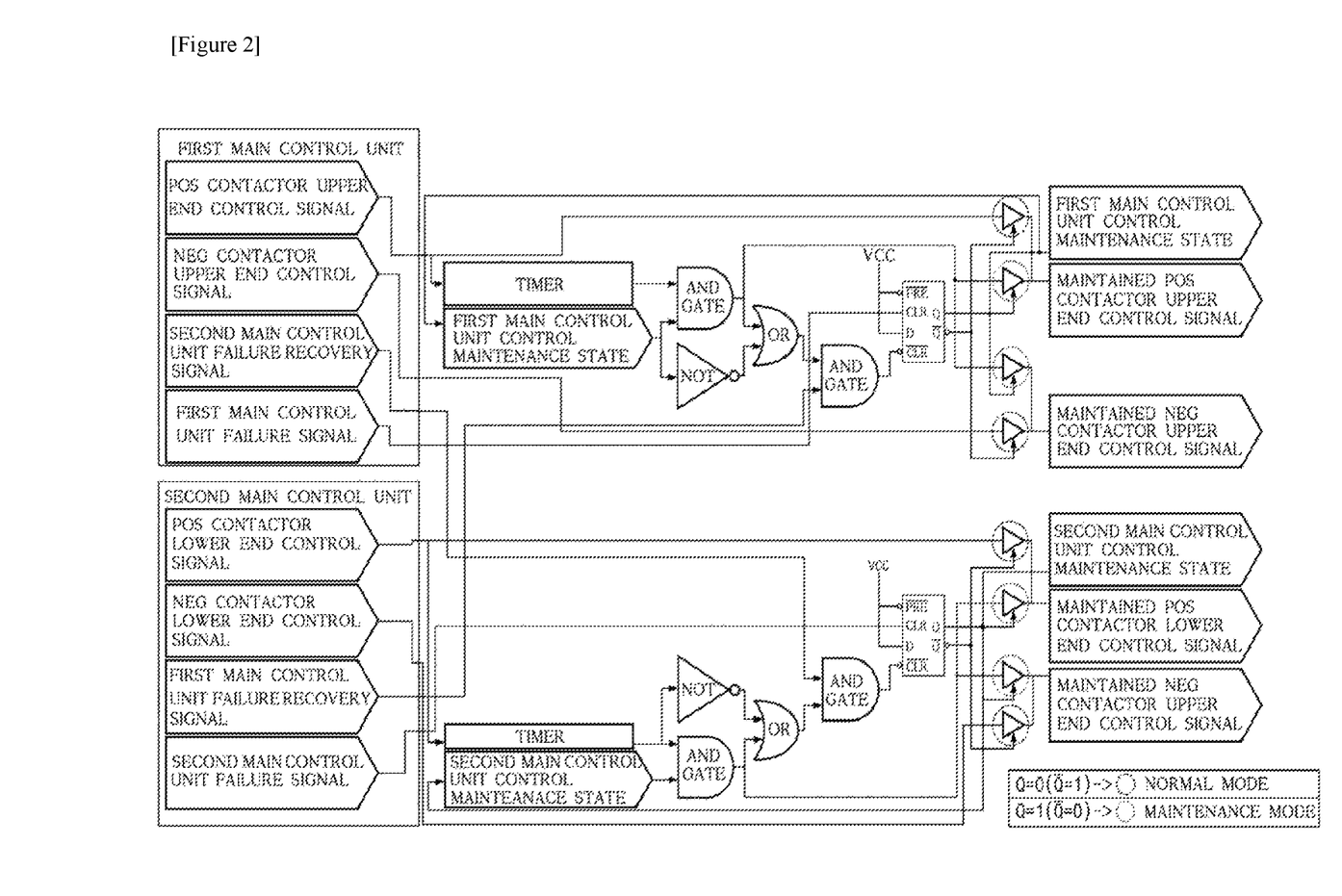
FIG. 2 is a schematic circuit diagram of the system 100 for preventing the contactor from being abnormally opened through a real-time operation detection according to the exemplary embodiment of the present invention.
Figure 3:
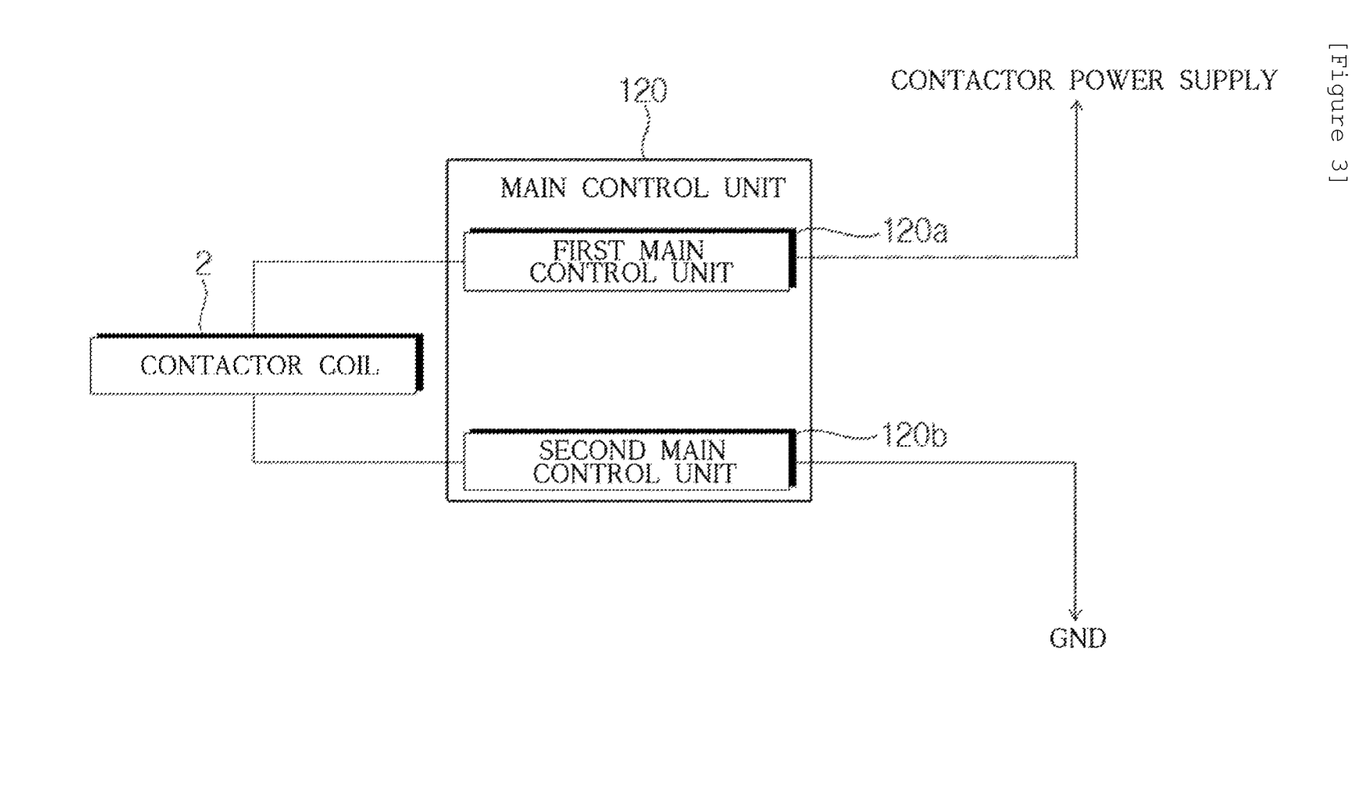
FIG. 3 is a diagram illustrating a configuration of a main control unit 120 illustrated in FIG. 1 in more detail.

FIG. 1 is a diagram illustrating a schematic configuration of a system 100 for preventing a contactor from being abnormally opened through a real-time operation detection according to an exemplary embodiment of the present invention, FIG. 2 is a schematic circuit diagram of the system 100 for preventing the contactor from being abnormally opened through a real-time operation detection according to the exemplary embodiment of the present invention, and FIG. 3 is a diagram illustrating a configuration of a main control unit 120 illustrated in FIG. 1 in more detail.

Referring to FIGS. 1 to 3, the system 100 for preventing a contactor from being abnormally opened through a real-time operation detection according to the present invention may generally include a contactor coil control unit 110 and a main control unit 120, and the main control unit 120 may additionally include first and second main control units 120a and 120b.

First, the contactor coil control unit 110 may serve to apply an operation signal to a contactor coil 2 provided in a contactor 1 which connects a battery (not illustrated) and an inverter (not illustrated).

Herein, the contactor 1 may generally mean a switching element which conducts or blocks a current flowing between the battery and the inverter between the battery and the inverter, and may be collectively called a relay.

The contactor 1 may be implemented with a contact point (not illustrated) and the contactor coil 1, when the contactor coil control unit 110 applies an operation signal (the operation signal may be an on or off signal, or a power application signal for initiating an on/off operation) to the contactor coil 1, electromagnetic force is generated in the contactor coil 2, so that the current may be conducted while the contact points are in contact with each other.

In the meantime, when a failure is generated in the contactor coil control unit 110 serving the foregoing function and an abnormal signal (for example, a signal for stopping the generation of the electromagnetic force of the contactor coil 2 in order to open the contact point of the contactor 1 even though a current vehicle (not illustrated) is travelling) is generated, the main control unit 120 which is to be described below may detect the abnormal signal in real time.

In the meantime, the contactor 1, the contactor coil 2, and the contactor coil control unit 110 described in the present specification use the publicly known technologies in the related art, so that detailed descriptions thereof will be omitted.

Next, when an operation signal is applied from the contactor coil control unit 110, the main control unit 120 may execute a first detection mode in order to detect the contactor coil control unit 110 in real time, and when it is determined that the applied operation signal is an abnormal signal, the main control unit 120 may execute a second detection mode, and the main control unit 120 may serve to directly control an operation state of the contactor coil 2 based on a maintenance time of the abnormal signal and forcibly open a state of the contact point of the contactor 1 or forcibly maintain a connection state.

More particularly, the first detection mode may be a normal mode executed when the contactor coil control unit 110 applies the operation signal (in this case, the operation signal may be a normal signal or an abnormal signal), and the second detection mode may be a maintenance mode executed for maintaining a connection state of the contact point of the contactor 1 for a predetermined time in order to prevent the contact point of the contactor 1 from being unexpectedly opened by the abnormal signal.

Accordingly, the case where the first detection mode is executed may mean that the normal signal (for example, a signal enabling the contact point of the contactor 1 to be operated in a connection state during the travelling of the vehicle) is presently applied from the contactor coil control unit 110 and electromagnetic force is generated in the contactor coil 2, and the case where the second detection mode is executed may mean that the abnormal signal (for example, a signal allowing the contact point of the contactor 1 to be unexpectedly operated in an open state during the travelling of the vehicle) is presently applied from the contactor coil control unit 110 and electromagnetic force generated in the contactor coil 2 is removable.

In this case, when the contact point of the contactor 1 is unexpectedly opened during the travelling of the vehicle, a safety accident by a sudden stop may be incurred, so that when the second detection mode is executed, the main control unit 120 may set a counting time for maintaining the connection state of the contact point of the contactor 1 for a predetermined time.

In this case, the counting time may be changed according to a setting by a user as much as possible, and the present invention will be described below based on five seconds of the counting time as an example.

In the exemplary embodiment, when an abnormal signal is applied from the contactor coil control unit 110 during the execution of the second detection mode, the corresponding abnormal signal is maintained for four seconds, and then a normal signal is applied again, the main control unit 120 compares the maintenance time of four seconds with a predetermined counting time of five seconds, determines that the abnormal signal is removed before the maintenance time reaches the counting time, and then determines whether the normal signal is applied from the contactor coil control unit 110.

That is, when the normal signal is applied after four seconds from the application of the abnormal signal from the contactor coil control unit 110, the main control unit 120 determines that a failure of the contactor coil control unit 110 is recovered and executes the first detection mode again, and detects whether an abnormal signal of the contactor coil control unit 110 is applied again in real time.

When the abnormal signal is applied from the contactor coil control unit 110 during the execution of the second detection mode and the maintenance time of the corresponding abnormal signal exceeds five seconds, the main control unit 120 compares the maintenance time of five seconds with the predetermined counting time of five seconds and determines that the contactor coil control unit 110 is currently in a failure state.

In this case, the main control unit 120 determines that a normal operation of the vehicle is impossible, generates an alarm signal which may notify a user that an operation of the vehicle will stop by forcibly opening the contact point of the contactor 1 in advance, and provides the generated alarm signal to a dash board of the vehicle or a user terminal, and then the main control unit 120 stops the operation of the vehicle by forcibly opening the contact point of the contactor 1, thereby preventing a safety accident due to the abnormal operation of the vehicle.

In the exemplary embodiment, the main control unit 120 may determine whether the vehicle is operated in real time based on an output voltage of the battery (not illustrated) and a driving state of the motor (not illustrated) during the execution of the second detection mode, and when it is determined that the vehicle is currently operated as a result of the determination, the main control unit 120 may set the counting time.

The reason is to remove a risk factor according to a vehicle sudden stop and the like incurrable when the abnormal signal is applied from the contactor coil control unit 110 and a conduction state of the motor is blocked in the vehicle that is being operated at a high speed.

Accordingly, even though a failure of the contactor coil control unit 110 is confirmed, the present invention may autonomously adjust whether to forcibly open the contact point of the relay 1 according to whether the vehicle is actually operated and defer the opening of the contact point for a predetermined time, so that it is possible to prevent a sudden stop of the vehicle due to a sudden stop of the motor and the like.

Further, in the exemplary embodiment, the main control unit 120 may determine whether the abnormal signal is a signal generated by a temporary external impact of the vehicle or a signal generated by an actual failure of the contactor coil control unit 110 based on the maintenance time of the abnormal signal applied from the contactor coil control unit 110 during the execution of the second detection mode, and deal with the abnormal signal during the travelling of the vehicle, so that even though the abnormal signal is applied in a vehicle that is being operated at a high speed, it is possible to accurately determine a reason of the application of the abnormal signal and accurately determine whether to stop or maintain an operation of the vehicle.

Referring to FIG. 3, the main control unit 120 may include the first main control unit 120a connectable to a terminal (for example, a positive (+) terminal) at one side of the contactor coil 2 and the second main control unit 120b connectable to a terminal (for example, a negative (−) terminal) at the other side of the contactor coil 2, and in this case, the first main control unit 120a may be connected between the contactor coil 2 and a contactor power supply (not illustrated) that supplies power to the contactor coil 2 and control a current supplied to the contactor coil 2, and the second main control unit 120b may be connected between the contactor coil 2 and a ground GND and serve to control a ground state of the contactor coil 2, and as a result, the main control unit 120 may directly control an operation state of the contactor coil 2 through the first and second main control units 120a and 120b.

Further, although not illustrated in the drawings of the present invention, the present invention according to the exemplary embodiment may further include a voltage determining unit (not illustrated) which measures a voltage of the battery (not illustrated) and a voltage of the inverter (not illustrated) according to the operation signal applied from the contactor coil control unit 120, and a current determining unit (not illustrated) which measures a current flowing between the battery and the inverter according to the operation signal applied from the contactor coil control unit 110.

When the foregoing configuration is included, the main control unit 120 may determine whether the operation signal applied from the contactor coil control unit 110 is a normal signal or an abnormal signal based on the measured current and a voltage difference between the battery and the inverter.

Next, a series of processes for preventing the contactor 1 from being abnormally opened will be described with reference to FIG. 4.

Figure 4:
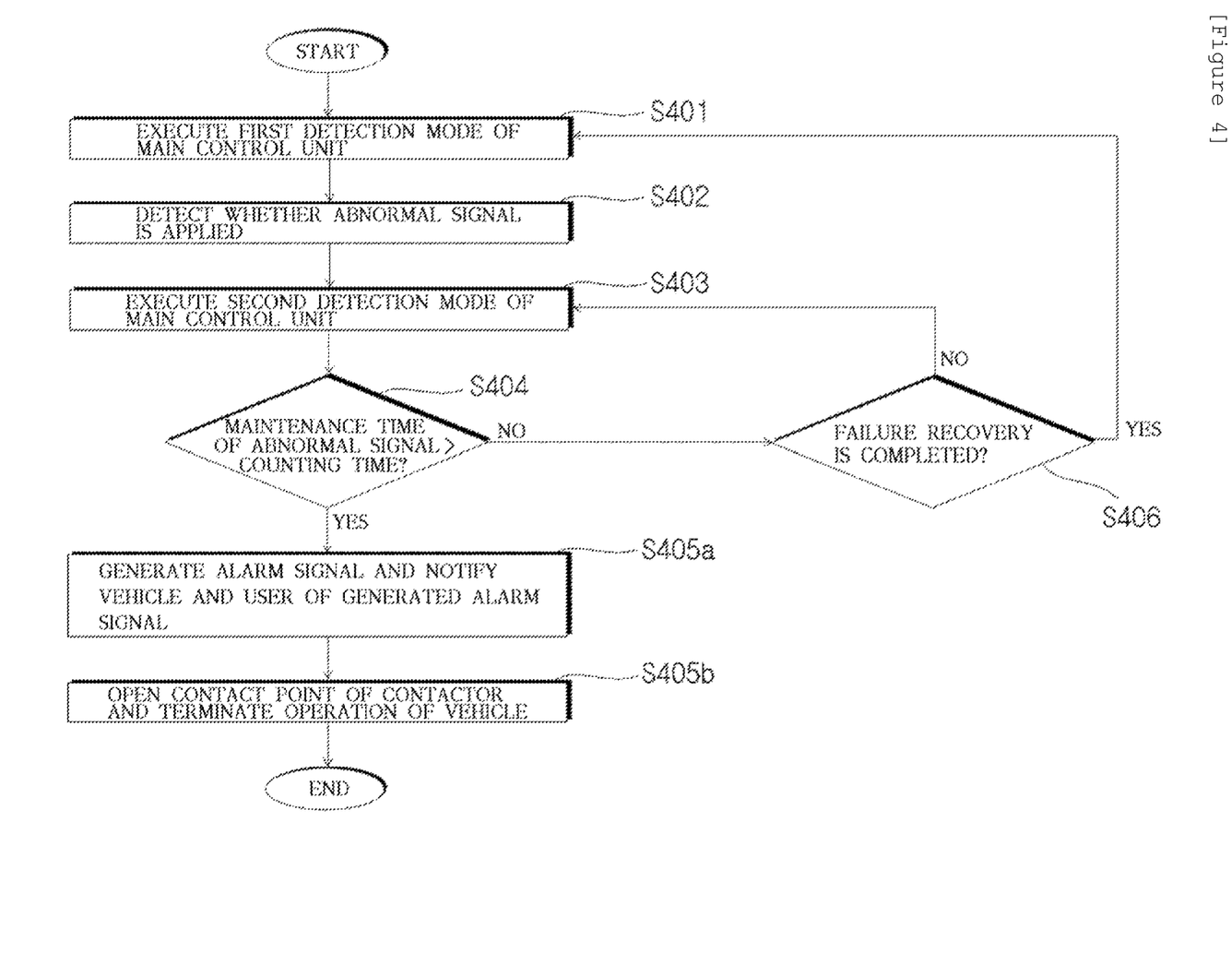
FIG. 4 is a diagram sequentially illustrating a series of processes for preventing a contactor 1 from being abnormally opened through the system 100 for preventing the contactor from being abnormally opened through a real-time operation detection illustrated in FIG. 1.

FIG. 4 is a diagram sequentially illustrating a series of processes for preventing the contactor 1 from being abnormally opened through the system 100 for preventing the contactor from being abnormally opened through a real-time operation detection illustrated in FIG. 1.

Referring to FIG. 4, when the contactor coil control unit 110 applies an operation signal to the contactor coil 2 and electromagnetic force is generated in the contactor coil 2, the contact point of the contactor 1 is connected (closed), and the main control unit 120 executes the first detection mode for detecting the signal applied from the contactor coil control unit 110 and an operation state of the contactor coil 2 in real time (S401).

Next, the main control unit 120, in which the first detection mode is being executed, detects whether an abnormal signal is applied from the contactor coil control unit 110 (S402), and when the abnormal signal is applied, a second detection mode for comparing a maintenance time of the corresponding abnormal signal is executed (S403).

Next, the main control unit 120 determines whether the maintenance time of the abnormal signal applied from the contactor coil control unit 110 exceeds a predetermined counting time (S404), and when it is determined that the maintenance time of the abnormal signal applied from the contactor coil control unit 110 exceeds the predetermined counting time, the main control unit 120 and notifies the vehicle or a user of an alarm signal in advance by providing the alarm signal to a dash board of the vehicle or a user terminal (S405a), and power applied to the contactor coil 2 is blocked through the first and second main control units 120a and 120b to stop the generation of electromagnetic force of the contactor coil 2 and forcibly open the contact point of the contactor 1 (S405b).

When it is determined that the maintenance time of the abnormal signal applied from the contactor coil control unit 110 does not exceed the predetermined counting time in operation S404, the main control unit 120 determines whether the failure of the contactor coil control unit 110 is recovered through whether a normal signal is applied from the contactor coil control unit 110 (S406), and when it is determined that the failure is completely recovered, the main control unit 120 is executed with the first detection mode from the second detection mode, and when it is determined that the failure is not completely recovered, the main control unit 120 compares the maintenance time of the abnormal signal applied from the contactor coil control unit 110 again while maintaining the execution of the second detection mode.

Although the present invention has been described with reference to the exemplary embodiments, those skilled in the art may understand that the present invention may be variously modified and changed within a scope without departing from the spirit and the area of the present invention described in the accompanying claims.

The invention claimed is:

1. A system for preventing a contactor from being abnormally opened through a real-time operation detection, the system comprising:
   a contactor coil control unit which applies an operation signal to a contactor coil provided in a contactor that connects a battery and an inverter; and
   a main control unit which detects the operation signal applied from the contactor coil control unit in real time through an execution of a first detection mode, and executes a second detection mode and directly controls an operation state of the contactor coil based on a maintenance time of an abnormal signal when it is determined that the applied operation signal is a non-predetermined abnormal signal.

2. The system of claim 1, wherein the first detection mode is a normal mode executed when the contactor coil control unit applies the operation signal, and
   the second detection mode is a maintenance mode executed for preventing a contact point of the contactor from being opened according to the application of the abnormal signal from the contactor coil control unit.

3. The system of claim 1, wherein the main control unit sets a counting time for maintaining a contact point of the contactor in a close state for a predetermined time during the execution of the second detection mode.

4. The system of claim 3, wherein when the maintenance time of the abnormal signal is less than the counting time during the execution of the second detection mode, the main control unit determines whether the contactor coil control unit applies a predetermined operation signal, and
   when it is determined that the contactor coil control unit applies the predetermined operation signal, the main control unit executes the first detection mode.

5. The system of claim 3, wherein when the maintenance time of the abnormal signal exceeds the counting time during the execution of the second detection mode, the main control unit forcibly opens the contact point of the contactor.

6. The system of claim 5, wherein the main control unit generates an alarm signal according to the forcible open of the contact point of the contactor.

7. The system of claim 3, wherein the main control unit determines whether the vehicle is operated in real time based on an output voltage of the battery during the execution of the second detection mode, and when it is determined that the vehicle is currently operated as a result of the determination, the main control unit sets the counting time.

8. The system of claim 1, wherein the main control unit determines whether the abnormal signal is a signal generated by an external impact of the vehicle or a signal generated by a failure of the contactor coil control unit based on the maintenance time of the abnormal signal during the execution of the second detection mode, and
   when it is determined that the contactor coil control unit incurred failure, the main control unit generates an alarm signal for the failure of the contactor coil control unit.

9. The system of claim 1, wherein the main control unit includes first and second main control units which are connected to terminals of both poles of the contactor coil, respectively, and the main control unit directly controls an operation state of the contactor coil according to the maintenance time of the abnormal signal through the first and second main control units.

10. The system of claim 1, further comprising:

a voltage determining unit which measures a voltage of the battery and a voltage of the inverter according to the operation signal applied from the contactor coil control unit; and a current determining unit which measures a current flowing between the battery and the inverter according to the operation signal applied from the contactor coil control unit, wherein the main control unit determines that the applied operation signal is the non-predetermined abnormal signal according to the measured current and a voltage difference between the battery and the inverter.

11. A method of preventing a contactor from being abnormally opened through a real-time operation detection, the method comprising:

applying, by a contactor coil control unit, an operation signal to a contactor coil provided in a contactor that connects a battery and an inverter; and detecting, by a main control unit, the operation signal applied from the contactor coil control unit in real time through an execution of a first detection mode, and executing a second detection mode and directly controlling an operation state of the contactor coil based on a maintenance time of an abnormal signal when it is determined that the applied operation signal is a non-predetermined abnormal signal.

12. The method of claim 11, wherein in the directly controlling of the operation state of the contactor coil, the first detection mode is a normal mode executed when the contactor coil control unit applies the operation signal, and the second detection mode is a maintenance mode executed for preventing a contact point of the contactor from being opened according to the application of the abnormal signal from the contactor coil control unit.

13. The method of claim 11, wherein the directly controlling of the operation state of the contactor coil includes setting a counting time for maintaining a contact point of the contactor in a close state for a predetermined time during the execution of the second detection mode.

14. The method of claim 13, wherein the directly controlling of the operation state of the contactor coil includes, when the maintenance time of the abnormal signal is less than the counting time during the execution of the second detection mode, determining, by the main control unit, whether the contactor coil control unit applies a predetermined operation signal, and when it is determined that the contactor coil control unit applies the predetermined operation signal, executing, by the main control unit, the first detection mode.

15. The method of claim 13, wherein the directly controlling of the operation state of the contactor coil includes, when the maintenance time of the abnormal signal exceeds the counting time during the execution of the second detection mode, forcibly opening, by the main control unit, the contact point of the contactor.

16. The method of claim 15, wherein the directly controlling of the operation state of the contactor coil further includes generating, by the main control unit, an alarm signal according to the forcible open of the contact point of the contactor.

17. The method of claim 13, wherein the directly controlling of the operation state of the contactor coil further includes determining, by the main control unit, whether the vehicle is operated in real time based on an output voltage of the battery, and when it is determined that the vehicle is currently operated as a result of the determination, setting the counting time during the execution of the second detection mode.

18. The method of claim 11, wherein the directly controlling of the operation state of the contactor coil includes determining, by the main control unit, whether the abnormal signal is a signal generated by an external impact of the vehicle or a signal generated by a failure of the contactor coil control unit based on the maintenance time of the abnormal signal during the execution of the second detection mode, and when it is determined that the contactor coil control unit incurred failure, generating an alarm signal for the failure of the contactor coil control unit.

19. The method of claim 11, wherein the directly controlling of the operation state of the contactor coil includes directly controlling an operation state of the contactor coil according to the maintenance time of the abnormal signal through first and second main control units, which are included in the main control unit and are connected to terminals of both poles of the contactor coil, respectively.

20. The method of claim 11, further comprising:

measuring, by a voltage determining unit, a voltage of the battery and a voltage of the inverter according to the operation signal applied from the contactor coil control unit; and measuring, by a current determining unit, a current flowing between the battery and the inverter according to the operation signal applied from the contactor coil control unit, wherein the directly controlling of the operation state of the contactor coil includes determining, by the main control unit, that the applied operation signal is the non-predetermined abnormal signal according to the measured current and a voltage difference between the battery and the inverter.

* * * * *